United States Patent
Box et al.

(10) Patent No.: US 7,470,916 B2
(45) Date of Patent: Dec. 30, 2008

(54) LITHOGRAPHIC APPARATUS, DEVICE MANUFACTURING METHOD AND RADIATION COLLECTOR

(75) Inventors: Wilhelmus Josephus Box, Ekse (BE); Harm-Jan Voorma, Zaltbommel (NL); Olav Waldemar Vladimir Frijns, 's-Hertogenbosch (NL); Maurice Pièrre Marie Arthur Limpens, Elsloo (NL)

(73) Assignee: ASML Netherlands B.V., Veldhoven (NL)

( * ) Notice: Subject to any disclaimer, the term of this patent is extended or adjusted under 35 U.S.C. 154(b) by 331 days.

(21) Appl. No.: 11/455,943

(22) Filed: Jun. 20, 2006

(65) Prior Publication Data
US 2007/0084461 A1    Apr. 19, 2007

Related U.S. Application Data (63) Continuation-in-part of application No. 11/253,054, filed on Oct. 19, 2005.

(51) Int. Cl.
*F24J 2/24* (2006.01)
*G03B 27/70* (2006.01)
*G01J 3/10* (2006.01)

(52) U.S. Cl. .............. 250/428; 250/429; 250/435; 250/493.1; 250/492.1

(58) Field of Classification Search ............. 250/428, 250/429, 435, 493.1, 492.1; 355/30, 45, 355/67
See application file for complete search history.

(56) References Cited

U.S. PATENT DOCUMENTS

| | | | |
|---|---|---|---|
| 6,859,259 B2 * | 2/2005 | Bakker et al. | 355/53 |
| 6,964,485 B2 | 11/2005 | Singer et al. | 359/850 |
| 7,088,424 B2 | 8/2006 | Bakker et al. | 355/53 |
| 2003/0043455 A1 | 3/2003 | Singer et al. | |
| 2004/0065817 A1 | 4/2004 | Singer et al. | |
| 2004/0109151 A1 | 6/2004 | Bakker et al. | |
| 2005/0105066 A1 * | 5/2005 | Adrianus Franken | 355/30 |
| 2005/0157284 A1 | 7/2005 | Moors et al. | 355/71 |
| 2007/0084461 A1 | 4/2007 | Box et al. | 126/625 |
| 2007/0085043 A1 * | 4/2007 | Franken et al. | 250/504 R |

FOREIGN PATENT DOCUMENTS

EP    1 225 481 A2    7/2002
EP    1 376 185 A2    1/2004

OTHER PUBLICATIONS

International Search Report issued for PCT Application No. PCT/NL2007/050295, dated Nov. 6, 2007.
International Search Report issued for PCT Application No. PCT/NL2007/050295, dated Jan. 2, 2008.
Notice of Allowance issued for U.S. Appl. No. 11/253,054, dated Aug. 28, 2008.

* cited by examiner

*Primary Examiner*—Nikita Wells
(74) *Attorney, Agent, or Firm*—Pillsbury Winthrop Shaw Pittman, LLP (57) ABSTRACT

A collector is disclosed that is constructed to receive radiation from a radiation source and to transmit radiation to an illumination system, the collector comprising a reflective element which is internally provided with a fluid channel.

25 Claims, 7 Drawing Sheets

LITHOGRAPHIC APPARATUS, DEVICE MANUFACTURING METHOD AND RADIATION COLLECTOR

This application is continuation-in-part application of co-pending U.S. patent application Ser. No. 11/253,054, filed on Oct. 19, 2005, the entire contents of which is hereby incorporated by reference.

FIELD

The present invention relates to an apparatus, a method for manufacturing a device and a radiation collector.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A conventional lithographic apparatus may comprise a collector to collect radiation from a radiation source. The collector may be arranged to transmit the collected radiation to an illumination system. Such an illumination system may be arranged to provide a projection beam of radiation, which is used to apply a desired pattern onto a target portion of a substrate. The collector may comprise, for example, suitable radiation reflective mirror shells. Particularly, the collector may be arranged to focus incoming radiation, received from the radiation source, onto a small focusing area or focus point.

For example, from United States patent application publication no. US 2005/0157284, an apparatus comprises a heater to heat a collector when the collector receives substantially no radiation from the radiation source. Further, U.S. Pat. No. 6,859,259 describes an apparatus wherein a reflector creates a low intensity zone behind an aperture.

A heat load, resulting from incoming radiation, may lead to thermal gradients of the collector. These temperature gradients may cause collector deformation, which may lead to a loss of optical performance.

SUMMARY

It is desirable, for example, to provide a lithographic apparatus wherein thermally induced collector deformation may be reduced or avoided.

According to an embodiment, there is provided an apparatus, comprising a collector that is constructed to receive radiation from a radiation source and to transmit radiation to an illumination system, wherein the collector comprises a reflective element which is internally provided with a fluid channel.

According to an embodiment, there is provided a method of manufacturing a radiation collector, the method comprising providing a reflective element, wherein a fluid channel is internally provided in the reflective element.

Further, according to an embodiment, there is provided a method of manufacturing a device, comprising:
transmitting radiation from a radiation source to an illumination system through a collector, the collector comprising a reflective element which is internally provided with a fluid channel;
providing a beam of radiation using the illumination system;
imparting the beam with a cross-sectional pattern to form a patterned beam of radiation;
projecting the patterned beam of radiation onto a target portion of a substrate; and
thermally conditioning the collector using a fluid, the fluid being fed through the fluid channel of the reflective element of the collector.

According to an embodiment, there is provided an apparatus, comprising a collector that is constructed to receive radiation from a radiation source and to transmit radiation to an illumination system, wherein the collector comprises a network of fluid channels, the fluid channels being branched off to reach certain parts of the collector which are to be thermally conditioned using fluid, wherein one or more parts of the fluid channels extend along circles around a common axis of rotation of the collector and one or more other parts of the fluid channels extend substantially in a longitudinal direction of the collector.

According to an embodiment, there is provided a radiation collector that is constructed to receive radiation from a radiation source and to transmit radiation to an illumination system, wherein the collector comprises a plurality of rotationally symmetric, concentric reflective elements, the reflective elements being connected to each other by coupling members, the coupling members providing respective downstream shadow areas and upstream virtual shadow areas during use, and a network of thermal conditioners to thermally condition the collector, wherein the network of thermal conditioners comprises one or more first thermal conditioners extending substantially in one or more of the shadow areas and/or virtual shadow areas provided by the coupling members and one or more second thermal conditioners, branched off from the one or more first thermal conditioners.

According to an embodiment, there is provided a method of manufacturing a device, comprising:
transmitting radiation from a radiation source to an illumination system through a collector, the collector comprising reflective elements and a plurality of coupling members which interconnect the reflective elements, such that, in the collector, shadow areas are created downstream from the coupling members, and virtual shadow areas upstream from the coupling members;
providing a beam of radiation using the illumination system;
imparting the beam with a cross-sectional pattern to form a patterned beam of radiation;
projecting the patterned beam of radiation onto a target portion of a substrate; and
thermally conditioning the collector using a number of first and second thermal conditioners, the first thermal conditioners being arranged in one or more of the shadow areas and/or virtual shadow areas provided by the coupling members of the reflective elements of the collector, and the second thermal conditioners being branched off the first thermal conditioners.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
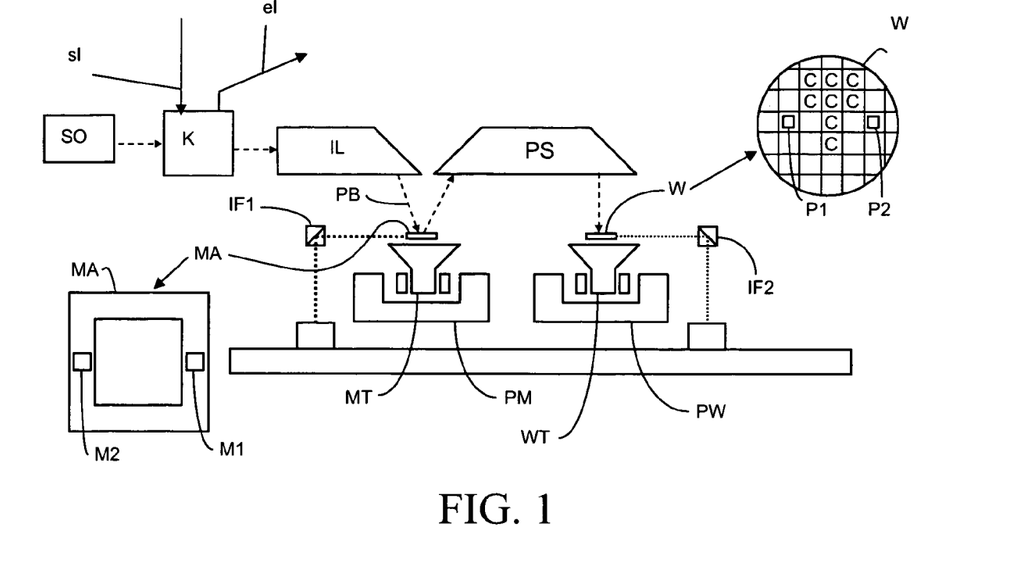
FIG. 1 schematically depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or other types of radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure may use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that may be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which may be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus, for example when the source is a mercury lamp. The source SO and the illuminator IL, together with the beam delivery system if required, may be referred to as a radiation system. In an embodiment, the radiation source is a tin (Sn) plasma EUV source. For example, in such a radiation source, Sn atoms may be heated (such as electrically) using a low power laser. The EUV radiation source may also be a different radiation source, such as a Li or Xe 'fueled' plasma radiation source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator may be adjusted. In addition, the illuminator IL may comprise various other components, such as an integrator and a condenser. The illuminator may be used to condition the radiation beam, to have a desired uniformity and intensity distribution in its cross-section.

The radiation beam PB is incident on the patterning device (e.g., mask) MA, which is held on the support structure (e.g., mask table) MT, and is patterned by the patterning device. Being reflected on the patterning device MA, the radiation beam PB passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam PB. Similarly, the first positioner PM and another position sensor IF1 can be used to accurately position the patterning device MA with respect to the path of the radiation beam PB, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
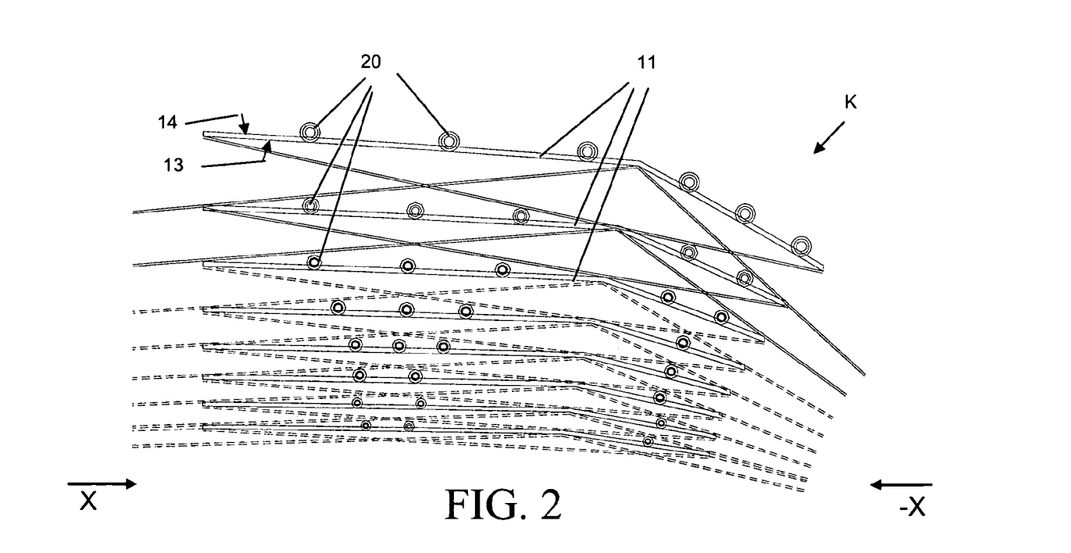
FIG. 2 schematically shows a longitudinal cross-section of part of an embodiment of a collector.
Figure 3:
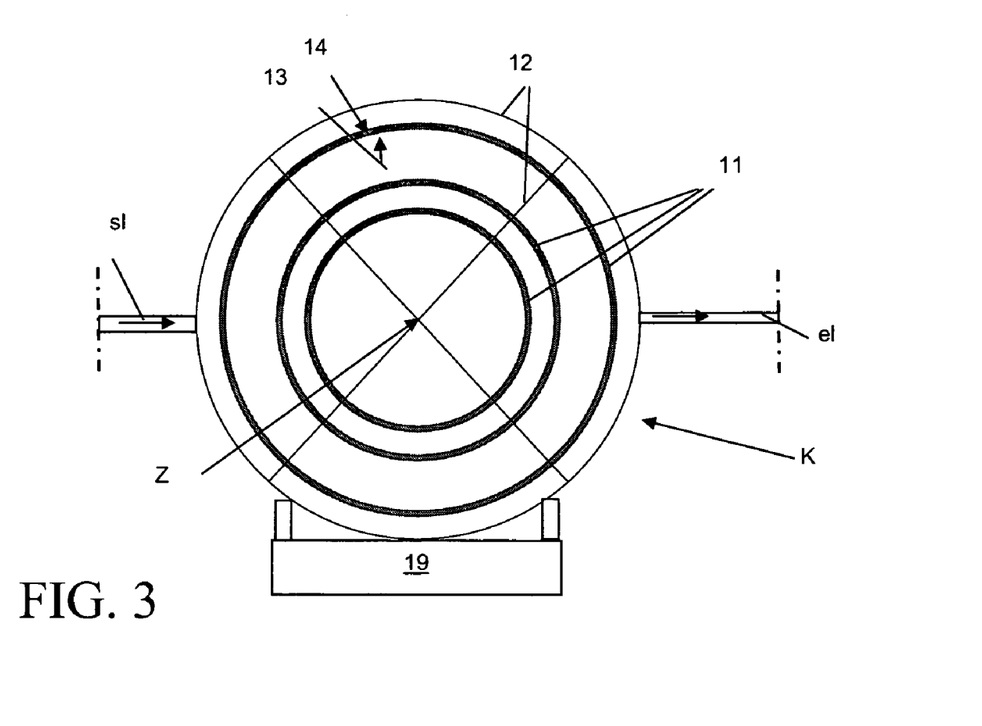
FIG. 3 schematically depicts a front view, in a direction X, of the embodiment of FIG. 2.
Figure 4:
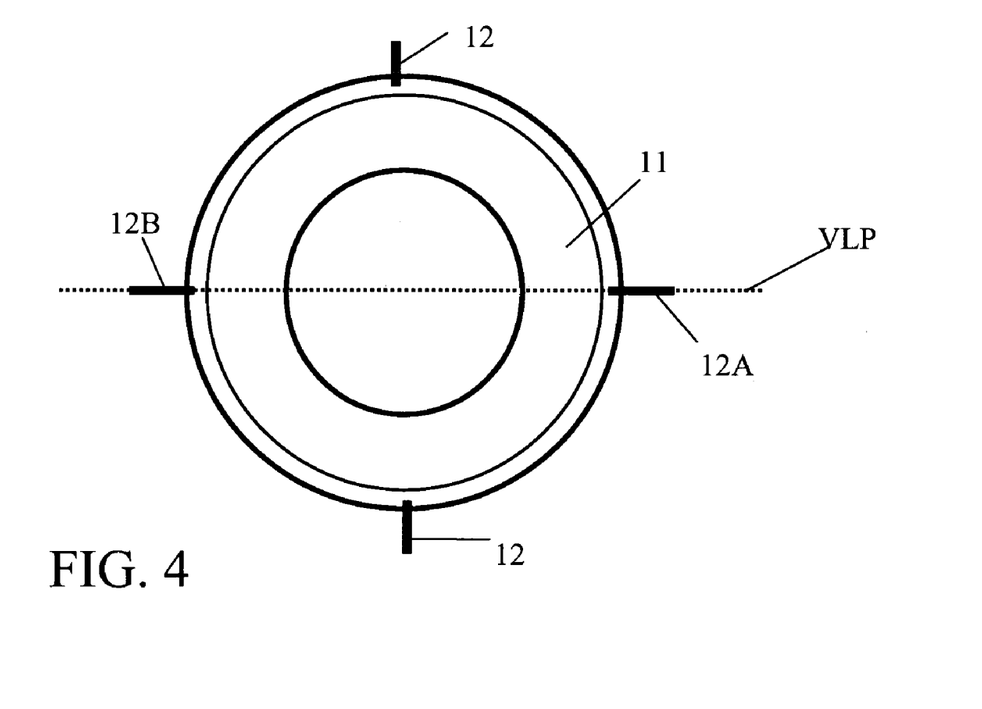
FIG. 4 schematically depicts a back view, in a direction –X in FIG. 2, of a reflective element of a collector.

FIGS. 2 and 3 show in more detail a collector K of the lithographic apparatus as shown in FIG. 1. The collector K comprises reflective elements 11 to focus radiation, which radiation the collector K receives from a (for example, intermittent) radiation source SO. The radiation source SO is depicted in FIG. 1. FIG. 4 shows a back view of one of the reflective elements 11 of the collector K.

The collector K may be arranged at least partly in accordance with the collector as described in European patent application publication no. EP 1 225 481, or in a different manner. For instance, the collector may be suitable for illumination systems with a wavelength of less than or equal to about 193 nm, less than or equal to about 126 nm, or particularly EUV wavelengths. In an embodiment, the collector comprises a plurality of reflective elements 11 in the form of rotationally symmetrical mirror shells, which are arranged in one another around a common axis of rotation Z (see FIG. 3). The concentrically arranged collector shells 11 may be attached to each other, for instance, by coupling members 12, for example spokes or spoke-like elements (as part of a spoke wheel) or other suitable coupling members or support elements, as depicted in FIG. 3. These coupling members 12, or parts thereof, are also depicted in FIG. 4. These coupling members 12 are not depicted in FIG. 2.

The coupling members 12 provide respective downstream shadow areas and upstream virtual shadow areas during use. For example, during use, when the collector K transmits radiation from the radiation source SO, the coupling members 12 create respective areas of low radiation in the system (the downstream shadow areas), downstream of the coupling members 12. The virtual upstream shadow areas are areas, extending upstream of the coupling members 12, that can be irradiated by the radiation source SO, during use. Placing objects in these virtual shadow areas will substantially not lead to less radiation downstream of the coupling members 12. Also, other shadow areas and low-radiation intensity areas, not resulting from or being associated with the coupling members 12, may be present in the collector K. See also, for example, U.S. Pat. No. 6,859,259. In the following, the term "shadow area" is used to encompass both a mentioned upstream virtual shadow area as well as a mentioned downstream shadow area, relating to the presence of a coupling member, except where specifically indicated otherwise.

Also, for example, the collector K can be provided with a suitable holder or support 19, to hold and/or support the collector K. Such a collector holder or support 19, which can be configured in various ways, is schematically depicted in FIG. 3. Each reflective element 11 can comprise a reflective inner surface 13 configured to reflect the radiation, as well as an outer surface 14 or back side which faces away from the reflective surface 13, see FIGS. 2 and 3. Each of the reflective elements 11 can themselves have a relatively good thermal conductance to provide a relatively good thermal uniformity of the element 11 during use. For example, each of the reflective elements 11 may be substantially made of one or more materials of relatively high thermal conductivities, for example one or more suitable metals and/or alloys, as will be appreciated by the skilled person. The collector parts may be assembled and/or formed in various ways, for example utilizing a suitable electroforming process, and/or in another way. For example, in an electroforming process of a collector element 11, mandrills (for example, aluminum solids) are produced. On the mandrill, a Cu or Ni layer, or a different layer, may be gradually deposited to form the reflective element 11. By rapidly cooling down the mandrill, the element 11 can come loose in one piece. Finally a reflective coating can be applied to the reflective element 11.

The collector K may be arranged to focus the incoming radiation onto a certain focus point. The focus point may be, for instance, a small focusing area. The focus point may be situated, for instance, before the illuminator IL of the lithographic apparatus.

During use of the apparatus in a device manufacturing method, the collector K may be heated by the incoming radiation. To thermally condition the collector K, for example to remove at least part of the heat from the collector K, the present collector embodiment K is provided with a one or more thermal conditioners 20, for example one or more fluid channels 20 and/or heat pipes, wherein each of the thermal conditioners may be configured to remove heat from the collector K and/or to provide heat to the collector K (if desired). A number of these thermal conditioners 20, for example fluid channels, is depicted, in cross-section, in FIG. 2. For example, one or more fluid channels may be used to direct or conduct one or more suitable fluids (e.g. a cooling fluid) along and/or through heated collector parts, such as along and/or through collector reflective elements 11, collector coupling members 12, collector holder or support 19, and/or other collector parts. For example, in an embodiment, the mentioned fluid is a liquid. A suitable liquid is, for example, water. One or more other or additional liquids may be used. Also, in an embodiment, the fluid may be or comprise one or more gases or a gas mixture.

The one or more thermal conditioners 20 may at least be used to cool the collector. Also, the one or more thermal conditioners 20 may be used to heat up the collector, in addition to the cooling of the collector, for example during different operating periods. As an example, the collector K may be cooled during at least a first period, particularly when the collector K receives radiation from the radiation source SO, to maintain the collector K at a substantially constant average operating temperature, or in a desired temperature range. During a second period, for example including when the collector K does not receive radiation from the radiation source SO, the collector may be heated. The second period may be, for example, a maintenance period, a period of apparatus idle time, a contamination removal period, a cleaning period, or a different period.

The one or more thermal conditioners, for example one or more fluid channels 20 and/or heat pipes, of the collector K may be arranged and configured in various ways. For example, the collector K may be provided with a network or system, or manifold structure, of thermal conditioners 20. The one or more thermal conditioners 20 may be branched off in a suitable fashion to reach certain parts of the collector K which are to be thermally conditioned, using fluid. One or more parts of the thermal conditioners 20 may extend along circles, around a common axis of rotation Z of the collector K. The one or more thermal conditioners 20, or parts thereof, can also extend in other directions, for example in a longitudinal collector direction and/or other direction. In an embodiment, the one or more thermal conditioners 20 are arranged and configured to provide a relatively homogeneous thermal conditioning of the collector, and particularly of at least the reflective elements 11 of the collector and of other collector parts such as the collector support 19 and coupling members 12.

Each thermal conditioner 20, for example fluid channel or heat pipe, of the collector may have various shapes, be provided in various ways, and/or be made of various materials. For example, a thermal conditioner 20 may comprise, or be, at least one channel, conduit, tube, pipe, through-hole, or other suitable means to conduct fluid. For example, a thermal conditioner 20 can have a substantially circular cross-section, as shown in FIG. 2, and/or a different cross-section such as square, rectangular, hexagonal or any other suitable shape. In an embodiment, each thermal conditioner 20 is in good thermal contact with a respective collector part.

For example, a thermal conditioner 20, for example a fluid channel or heat pipe, may be an integral part of the collector. For example, a reflective element 11 may be internally provided with one or more channels which form one or more of the thermal conditioners 20.

An embodiment, having internally provided fluid channels is described below with respect to FIGS. 13 and 14. The fluid channel 20 may comprise, for example, a plurality of relatively small tubes which are integrally formed with the collector. Also, in an embodiment, the one or more thermal conditioners 20 may be mounted substantially onto a reflective element 11 and/or other collector part 12, 18, for example onto and/or in an outer surface 14 of a reflective element 11 (as depicted in FIG. 2).

One or more thermal conditioners 20 may be mounted or coupled to the collector K in various ways, for example by welding, gluing, melting, electroforming, bonding, riveting, clamping and/or in other suitable ways, depending for example on the materials used. For example, the one or more thermal conditioners 20 may be mounted onto one or more respective collector parts 11, 12, 18 during assembly and/or the forming of those collector parts 11, 12, 18. Also or alternatively, one or more parts of the one or more thermal conditioners 20 may be integrally formed in a respective collector part, and one or more other parts of the one or more thermal conditioners 20 may be mounted or coupled substantially onto a respective collector part.

For example, a mentioned collector fluid channel 20 may be made of one or more plastics, metals, alloys and/or a combination of such materials and/or other materials. Also, fluid running through a fluid channel 20 may be in a good thermal contact with a respective collector part to be thermally conditioned by the fluid. To the skilled person it will be clear how such a good thermal contact may be achieved, for example by constructing the respective fluid channel 20 from material having a high thermal conductivity, by mounting the fluid channel using a method which leads to a good thermal contact and/or by providing the fluid channel integrally in a respective collector part.

In case of the application of one or more fluid channels 20 as one or more thermal conditioners, the one or more fluid channels 20 may be coupled upstream to a fluid supply line sl, to supply fluid to the one or more fluid channels 20. Part of this supply line sl is depicted in FIG. 3. The supply line sl is also schematically depicted in FIG. 1. The one or more fluid channels 20 may be coupled downstream to a fluid exhaust line el, to remove the fluid from the one or more fluid channels 20 of the collector K. Part of this exhaust line el is depicted in FIG. 3. The exhaust line el is also schematically depicted in FIG. 1. In an embodiment, only one external fluid supply line sl and only one external fluid exhaust line el are provided. However, more than one external fluid supply line sl and/or more than one external fluid exhaust line el may be provided. Each of the supply line sl and exhaust line el may be provided in various ways, for example by one or more suitable fluid channels, tubing, conduits and/or other means.

Figure 5:
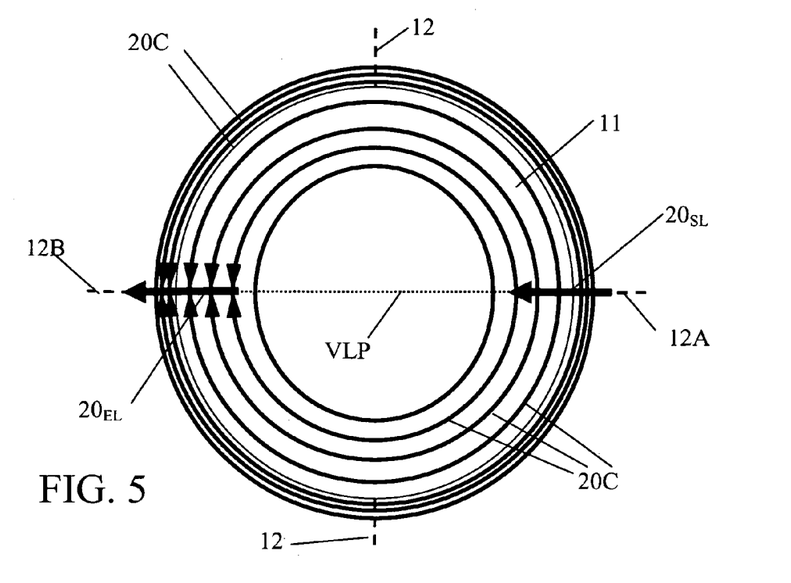
FIG. 5 is similar to FIG. 4 and schematically depicts a back view, in a direction –X in FIG. 2, of an embodiment of a reflective element of a collector.
Figure 6:
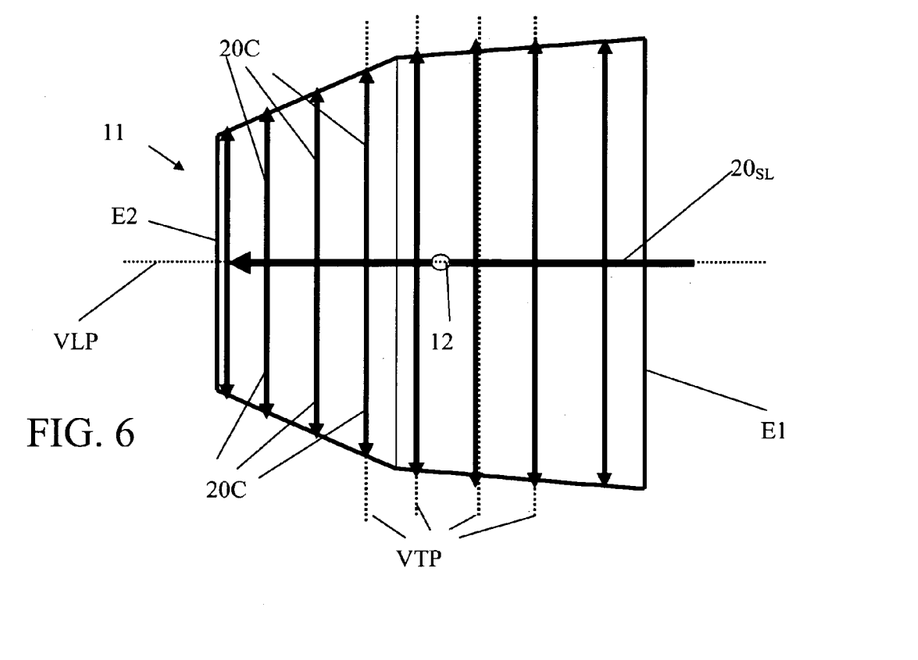
FIG. 6 schematically depicts a side view of the reflective element shown in FIG. 5.

FIGS. 5 and 6 schematically show a front view and side view, respectively, of a further embodiment of a reflective element 11 of a collector K. Locations of a plurality of radial coupling members 12, for example spokes or spoke-like elements or other suitable coupling members, are indicated by respective dashed lines 12 in FIG. 5 (see also FIG. 4). The present embodiment comprises four such radial coupling members 12, however, a different number of coupling members, for example six, eight or another number, may be provided.

In this embodiment, each element 11 of the collector K integrally comprises an axial symmetric network or system of fluid channels 20. The fluid channels 20 are arranged to reach various parts of the element 11 to thermally condition the element 11 using fluid.

In the embodiment, substantially two types of fluid channels may be distinguished: first (main) channels $20_{SL}$, $20_{EL}$ extending substantially in the shadow areas and/or virtual shadow areas provided by the coupling members 12, and second (secondary) channels 20C branched off from the one or more first channels $20_{SL}$, $20_{EL}$. In an embodiment, the first channels $20_{SL}$, $20_{EL}$ may accommodate larger fluid flow than the branched off second channels 20C, for example by being larger, or having a larger interior cross-sections, than the second channels 20C.

At least some of the second channels 20C may also extend in areas of low radiation, for example similar to a collector which is described in U.S. Pat. No. 6,859,259.

In the embodiment, the first channels $20_{SL}$, $20_{EL}$ of the fluid channel system extend in a longitudinal collector direction. The second channels 20C extend substantially along circles, around a common axis of rotation of the element 11 of the collector K. Particularly, the second channels 20C extend substantially along circles that are concentric with a common longitudinal center axis of the collector, after mounting.

In the embodiment, each element 11 comprises a longitudinal fluid supply channel $20_{SL}$, which branches off into a plurality of secondary channels 20C. These secondary channels 20C extend in a circumferential direction around the element 11, each of these circumferential channels extending over only part of the circumference (substantially half the circumference, in the present embodiment) of the element 11.

In the embodiment, the circumferential channels 20C branch off laterally from the supply channel $20_{SL}$, and particularly extend in pairs, in opposite directions, from the supply channel $20_{SL}$. At an opposite side of element 11, each member of a pair of circumferential channels 20C joins each other, at a fluid exhaust channel $20_{EL}$ which extends longitudinally. Directions of fluid flow are indicated with respective arrows in FIGS. 5 and 6. Note, that it is not essential that circumferential channels extend in pairs. For example, there may be provided one or more fully circumferential extending channels (each one extending substantially along a full circle). In that case, a supply channel and return channel may be provided together, on one side of the element 11, extending in the same shadow area.

Also, for example, after assembly of the collector K, the supply channel $20_{SL}$ of each element 11 may be coupled to the above-mentioned supply line sl, and the exhaust channel $20_{EL}$ of each element 11 may be coupled to the above-mentioned exhaust line el, in a suitable fashion, to supply fluid to the channel network 20 and to receive the fluid therefrom.

The network of fluid channels 20 may be arranged in many different ways. For example, second channels 20C may be provided, which extend over shorter ranges over a circumference of the element 11 than half the circumference, for example one or more second channels 20C extending over a quarter of the circumference of the element 11, or over a different range. Also, more than one first longitudinal supply channel $20_{SL}$ and/or more than one first longitudinal exhaust channel $20_{EL}$ may be provided (see also below).

In the embodiment of FIGS. 5 and 6, the fluid supply channel $20_{SL}$ and fluid exhaust channel $20_{EL}$ are arranged mirror-symmetrically with respect to each other, viewed from the optical axis—or virtual center axis—of the element 11. The fluid supply channel $20_{SL}$ extends substantially in the shadow area of one of the support members 12A. The fluid exhaust channel $20_{EL}$ extends substantially in the shadow area of an other of the support members 12B, the other support member 12B being located opposite the former mentioned support member 12A with respect of the virtual center axis of the element 11. Therefore, the two first fluid channels $20_{SL}$, $20_{EL}$ extend substantially in different shadow areas provided by the coupling members of the reflective elements.

Also, for example, in the present embodiment, each coupling member 12 extends substantially laterally with respect to a virtual center axis of the element 11 of the collector. Both the fluid supply channel $20_{SL}$ and the exhaust channel $20_{EL}$ extend substantially along a respective virtual longitudinal plane VLP, which plane contains the center axis of the collector (after assembly) and intersects respective opposite coupling members 12A, 12B of the collector. An example of a mentioned virtual longitudinal plane VLP is indicated by dotted lines VLP in FIGS. 4, 5 and 6. As is shown, the second circumferential channels 20C extend along respective virtual transversal planes VTP of the reflective element 11. Locations of some of these virtual transversal planes are indicated by dotted lines VTP in FIG. 6.

In the present embodiment, during use, fluid may flow through the supply channel $20_{SL}$ in a direction from a first end E1 of the element 11 towards a second end E2 thereof, wherein fluid flow through the exhaust channel $20_{EL}$ may be in an opposite direction (from the second end E2 towards the first end E1).

In the embodiment of FIGS. 5 and 6, both first channels $20_{SL}$, $20_{EL}$ extend substantially along the full length of the reflective element 11 of the collector. As follows from the above, both the first and second fluid channels 20 may be provided onto a respective reflective element 11, or, alternatively, substantially internally through a respective reflective element 11.

The embodiment of FIGS. 5 and 6 may be used as part of a radiation collector K, to be utilized in a method of manufacturing a device, the method comprising providing a substrate, providing a radiation source, transmitting radiation from the radiation source to an illumination system through a collector, the collector comprising reflective elements and a plurality of coupling members which interconnect the reflective elements, such, that in the collector, shadow areas are created downstream from the coupling members, and virtual shadow areas exist upstream from the coupling members, providing a beam of radiation using the illumination system, imparting the beam with a cross-sectional pattern to form a patterned beam of radiation, and projecting the patterned beam of radiation onto a target portion of the substrate. In that case, the collector K may be thermally conditioned using the first and second fluid channels 20, wherein all first channels 20 are arranged in the shadow areas and/or virtual shadow areas provided by the coupling members 12 of reflective elements 11 of the collector K.

The embodiment of FIGS. 5 and 6 may provide good uniform thermal conditioning of the reflective element 11, and thus, of the collector K. Herein, locations of the first fluid channels (i.e a supply channel $20_{SL}$ and an exhaust channel $20_{EL}$) may provide an improved parallel axial symmetric thermal conditioning. Therefore, undesired non-axial-symmetric deformation of the collector K may be prevented, or at least significantly reduced, leading to an improved performance of the collector K.

As an example, in the embodiment of FIGS. 5 and 6, water may be used as a conditioning liquid. In that case, the longitudinal supply channel $20_{SL}$ and exhaust channel $20_{EL}$, extending in spoke shadows over the reflective element 11 in a longitudinal direction, and the secondary channels 20C running axial-symmetric over the reflective element 11 (in an embodiment, also in certain shadow areas or areas of less radiation), may create a parallel axial symmetric water conditioning circuit.

Figure 7:
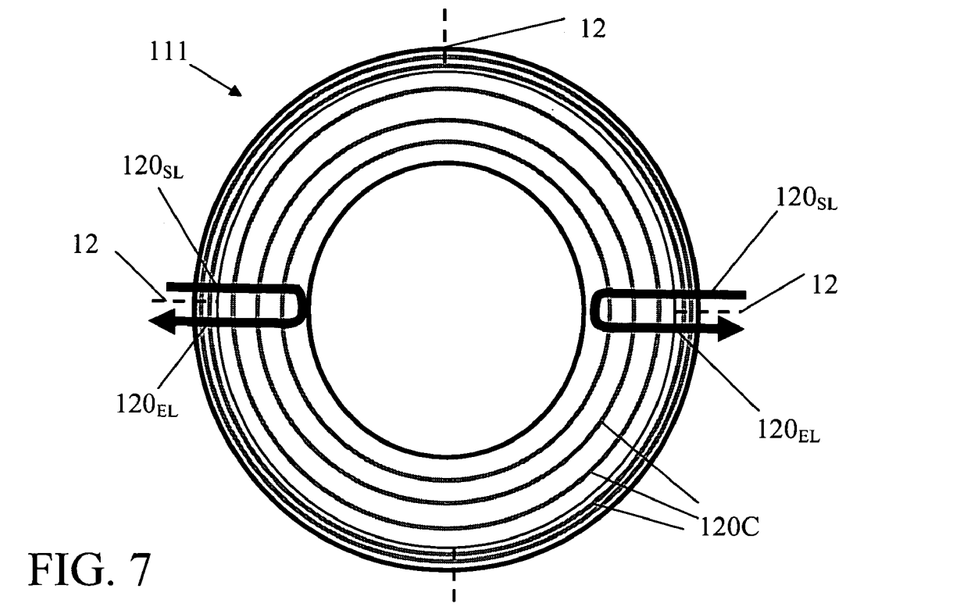
FIG. 7 schematically depicts a back view of a further embodiment of a reflective element of a collector.
Figure 8:
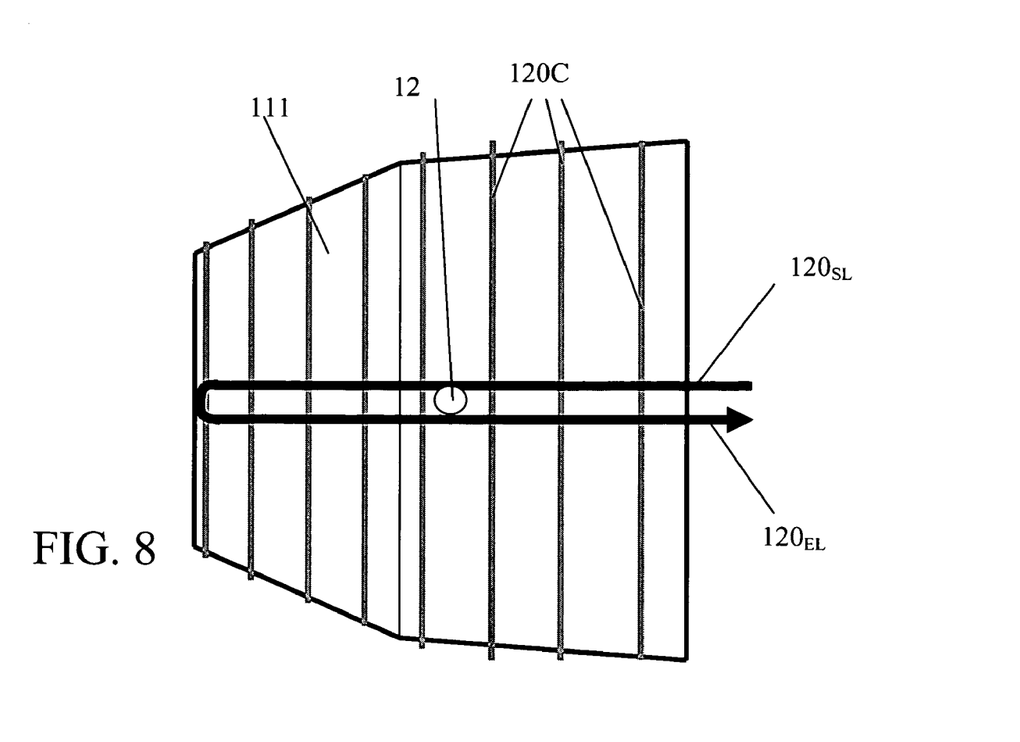
FIG. 8 schematically depicts a side view of the reflective element shown in FIG. 7.

Instead of or additionally to the mentioned fluid channel 20, a thermal conditioner may consist of, or comprise, a heat pipe. Each heat pipe may provide a simple, efficient passive thermal conditioning means. For example, FIGS. 7 and 8 depict an embodiment of a reflective element 111 of a collector K, comprising heat pipes 120C running in axial symmetric direction along the reflective element 111 (for example at least partly in certain low-radiation areas). These heat pipes 120C may be thermally connected to a supply and return liquid cooling channels $120_{SL}$, $120_{EL}$ running in the shadow area of coupling members 12, as mentioned above. For example, two pairs of supply and exhaust channels $120_{SL}$, $120_{EL}$ may be provided, on opposite sides of the reflective element 111, each of the pairs $120_{SL}$, $120_{EL}$ substantially extending in a respective shadow area of a coupling member 12. The operation of the embodiment of FIGS. 7 and 8 is similar to that of the embodiment of FIGS. 5 and 6, wherein the heat pipes 120C exchange heat with the main supply channels $120_{SL}$, $120_{EL}$. The embodiment of FIGS. 7 and 8 may provide an improved axial symmetric thermal conditioning of the reflective element 111, wherein heat may be removed from (or, if desired, supplied to) the reflective element 111 in an axial symmetric way.

Figure 9:
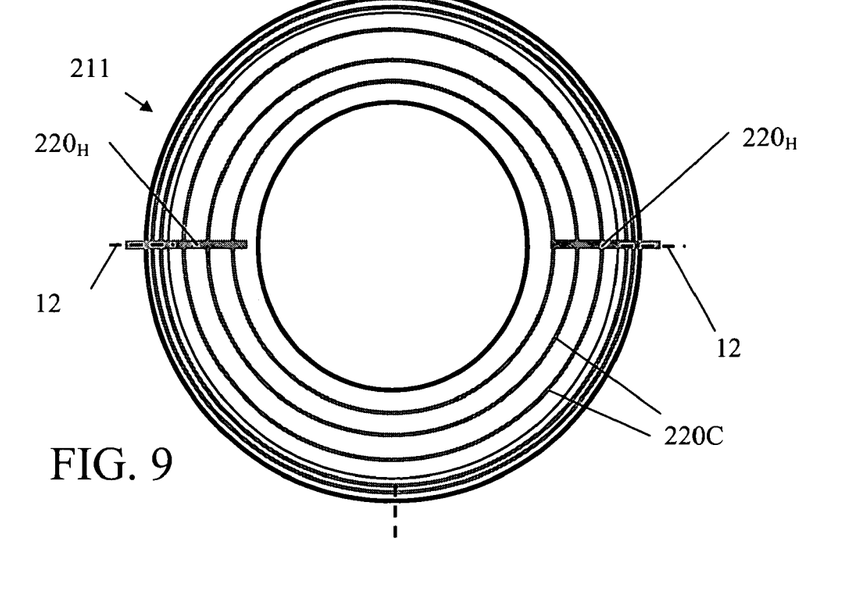
FIG. 9 schematically depicts a back view of a further embodiment of a reflective element of a collector.
Figure 10:
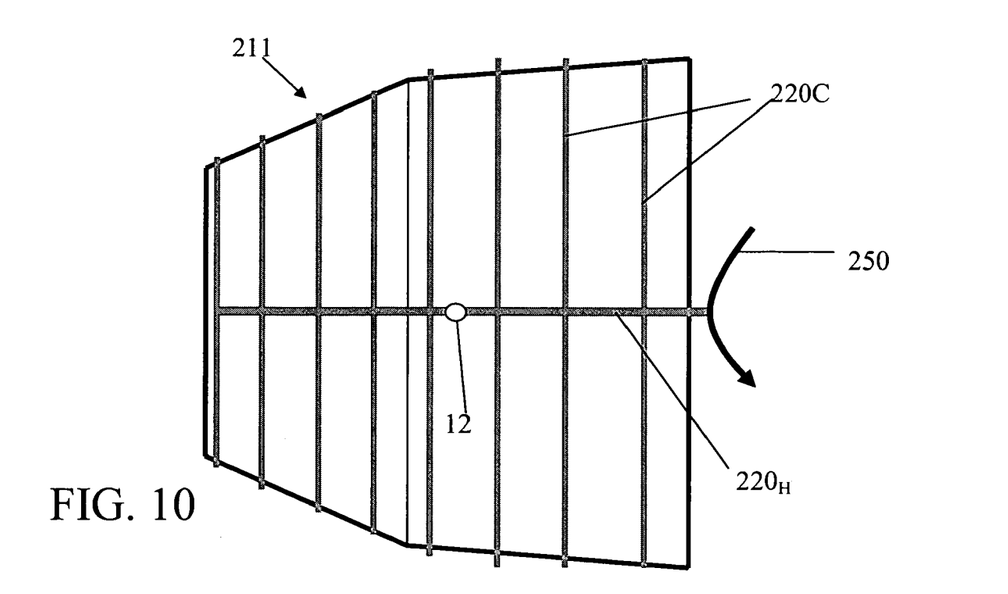
FIG. 10 schematically depicts a side view of the reflective element shown in FIG. 9.

FIGS. 9 and 10 show an embodiment of a reflective element 211 of a collector K, comprising axially symmetric heat pipes 220C and main heat pipes $220_H$ running in longitudinal directions of the reflective element 211. For example, the main heat pipes $220_H$ may be thermally connected to a reservoir or main fluid channel 250, to transfer heat between that reservoir or channel 250 and the collector reflective element 211. For example, a main water channel 250 may be provided, so that water cooling is only required at the end of the main heat pipes (such as at a mentioned spoke wheel of the collector K).

In the above embodiments, only the shadow areas of two of the coupling members 12 are used to accommodate respective thermal conditioners 20. In an embodiment, the shadow areas of all of the coupling members 12 may comprise one or more longitudinal thermal conditioners 20. For example, the number of first longitudinal thermal conditioners may be equal to the number of spokes 12, resulting in a better temperature uniformity. Further, the coupling members 12 themselves may be integrally provided with or connected to the one or more thermal conditioners 20.

By using the mentioned coupling member shadow areas as main heat-supply/exhaust tubes, especially where this is done in every spoke shadow (for example, at least a main supply being provided in every spoke area), the axial symmetry of thermal conditioning of the collector K may be optimized. As an example, a single coaxial circular cooling channel that is supplied at only one point in the circumference of the element 11 may have a much larger heat up of a conditioning fluid than six cooling channels, that are equally divided over the circumference of the element 11 and that extend along the same part of the circumference of the element 11, one after another. For the application of heat pipes, the same reasoning is valid. Also, by having main longitudinal supply lines or heat pipes, the temperature uniformity in the longitudinal direction may be improved, particularly in case all coaxial cooling channels 20C or coaxial heat pipes 120C, 220C start at the same temperature. Further, a spider web spoke area may be used as main supply tube (as some kind of manifold), to minimize or reduce coaxial temperature non-uniformities of the collector K.

As follows from the above, in an embodiment, the collector K may comprise at least one reflective element 11 which is internally provided with one or more fluid channels 20. This is, for example, depicted in FIG. 13.

Figure 11:
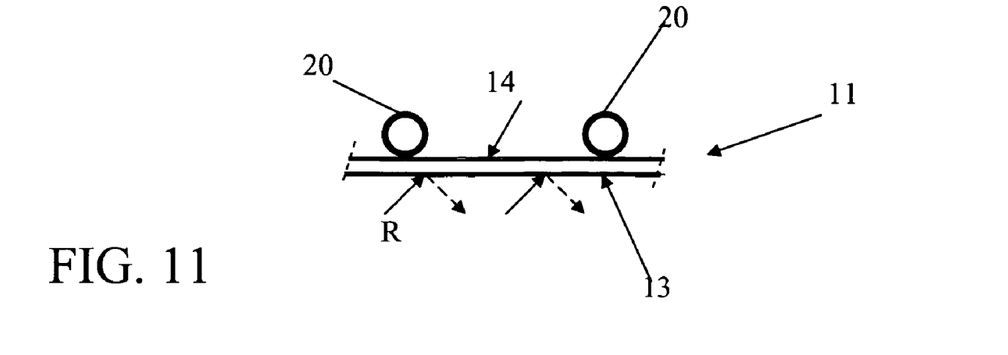
FIGS. 11 and 12 depict part of an embodiment of a reflective element of a collector, in lateral cross-section.
Figure 12:
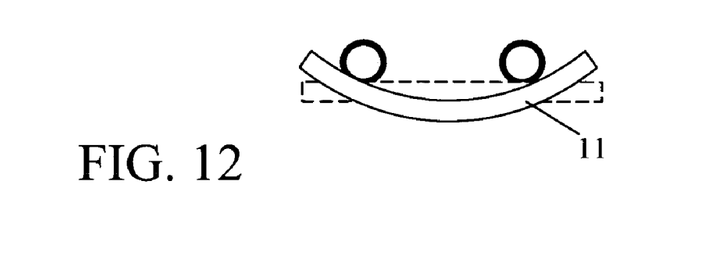

As an example, FIGS. 11 and 12 show a cross-section of part of a reflective element 11 of a collector K, wherein thermal conditioning fluid channels 20 (for example cooling channels) are provided onto the outer surface of the element 11. During use, impinging radiation R may heat up the element 11. As a heat load is transported through the element material towards the cooling channels 20, a temperature gradient in the element 11 may occur. The temperature gradient may cause thermo-mechanical deformations of the element 11, which is indicated in FIG. 12, which also results in deformation of the reflective surface. Deformation of the reflective surface may result in loss of optical performance of the collector K.

Figure 13:
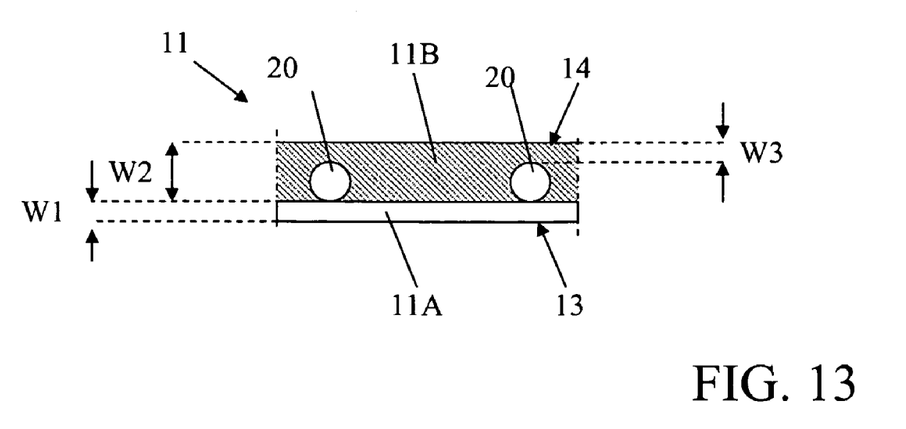
FIG. 13 depicts part of an embodiment of a reflective element of a collector, in lateral cross-section.

FIG. 13 depicts part of an embodiment of a reflective element of a collector, in lateral cross-section, configured to inhibit some or all such thermo-mechanical deformation. In the embodiment of FIG. 13, fluid channels are integrally formed in the reflective element 11. In a further embodiment, for example, the reflective element 11 comprises a first layer 11A, having the reflective surface, and a second layer 11B extending on the first layer 11A, the second layer 11B being internally provided with the fluid channels 20. Thus, the reflective element surrounds each of the respective fluid channels 20. The collector element 11 may also be provided with one or more further layers, for example one or more reflective coatings extending on the first layer 11A to enhance reflectivity of the reflective surface.

The two layers 11A, 11B may be configured in various ways, and may have various layer thicknesses and may also comprise various materials. For example, the second layer 11B of the reflective element may be thicker than the first layer, as in the present embodiment.

Particularly, each fluid channel 20 may extend and/or may be located closer to the reflective surface 13 of the reflective element than to a back surface 14 of the reflective element, the back surface 14 facing away from the respective reflective surface 13. In the present embodiment, the distance between the reflective surface 13 and the fluid channels 20 equals a thickness W1 of the first layer 11A. A distance between the fluid channels 20 and the back surface 14 is indicated by an arrow W3 in FIG. 12 (e.g., W3 may be larger than or equal to W1). The mentioned distances are measured in a direction normally with respect to the reflective surface 13.

In an example, a minimum overall thickness of the reflective element 11, which includes the thickness W1 of the first layer plus a thickness W2 of the second layer, may be less than about 10 mm, for example about 5 mm or less. As a non-limiting example, the minimum overall thickness of the element 11 may also be about 2 mm or larger. Further, the thickness of a reflective element 11 may vary along its length. Various reflective elements 11 of a collector K may have substantially the same overall thickness. Alternatively, inner reflective elements may be provided somewhat thinner than outer reflective elements. Also, as a non-limiting example, the first layer 11A may be relatively thin, having a thickness of about 2 mm or less.

In an embodiment, the first and second layers 11A, 11B of the reflective element 11 are made of the same material, for example a metal and/or alloy, for example copper (Cu) or nickel (Ni). Also, for example, the first and second layers 11A, 11B may have substantially the same thermal expansion coefficient, or at least be substantially made of materials having substantially the same thermal expansion coefficient. Alternatively, the first layer 11A of the reflective element may have a first thermal expansion coefficient, wherein the second layer 11B of the reflective element may have a second thermal expansion coefficient. In that case, for example, the second thermal expansion coefficient may be lower than the first thermal expansion coefficient, providing a good thermal stability of the element 11. In that case, the layers are desirably attached firmly to each other, uniformly along their surfaces to prevent warping of the element 11.

Also, there is provided a method of manufacturing a radiation collector, the method comprising providing a reflective element, wherein a fluid channel is internally provided in the reflective element. This method may be carried out in various ways. As an example, the fluid channel may comprise a plurality of relatively small tubes 20 which are cm,integrally formed with the reflective element 11 (as in FIG. 13).

In a further embodiment, the method may comprise carrying out at least the following steps, in a suitable order: providing a first layer 11A, the first layer being provided with a radiation reflective surface, providing a fluid channel 20 onto a back surface of the first layer, and providing a second layer 11B onto the back surface of the first layer 11A, such that the fluid channel 20 is embedded in the second layer 11B. The manufacturing may involve a suitable electroforming process. For example, in an electroforming process of a collector element 11, on a mandrill, suitable material may be gradually deposited to form the first layer 11A of the collector element 11, for example using a galvanic growing process. After that, the one or more fluid channels 20 may be mounted onto the first layer 11A, after which the deposition of material is continued to form the second layer 11B, thus embedding the one or more fluid channels 20 into the second layer 11B. For example, the fluid channel 20 may be fully embedded in the reflective element 11 (as in FIG. 13), or partially as is shown in FIG. 2.

In another manufacturing method, a first layer 11A and a second layer 11B may be formed, after which the layers are fixed onto each other to form the reflective element 11. In that case, one or both layers may be provided with a certain relief, profile or grooves, such that the layers together form the one or more fluid channels 20 after being joined together.

Also, the embodiment of FIG. 13 may be used in a method of manufacturing a device, the method comprising: providing a substrate; providing a radiation source; transmitting radiation from the radiation source to an illumination system through a collector; providing a beam of radiation using the illumination system; imparting the beam with a cross-sectional pattern to form a patterned beam of radiation; and projecting the patterned beam of radiation onto a target portion of the substrate. Then, the collector K may be thermally conditioned using a fluid, the fluid being fed through a fluid channel 20 which runs internally through a reflective element of the collector K.

Figure 14:
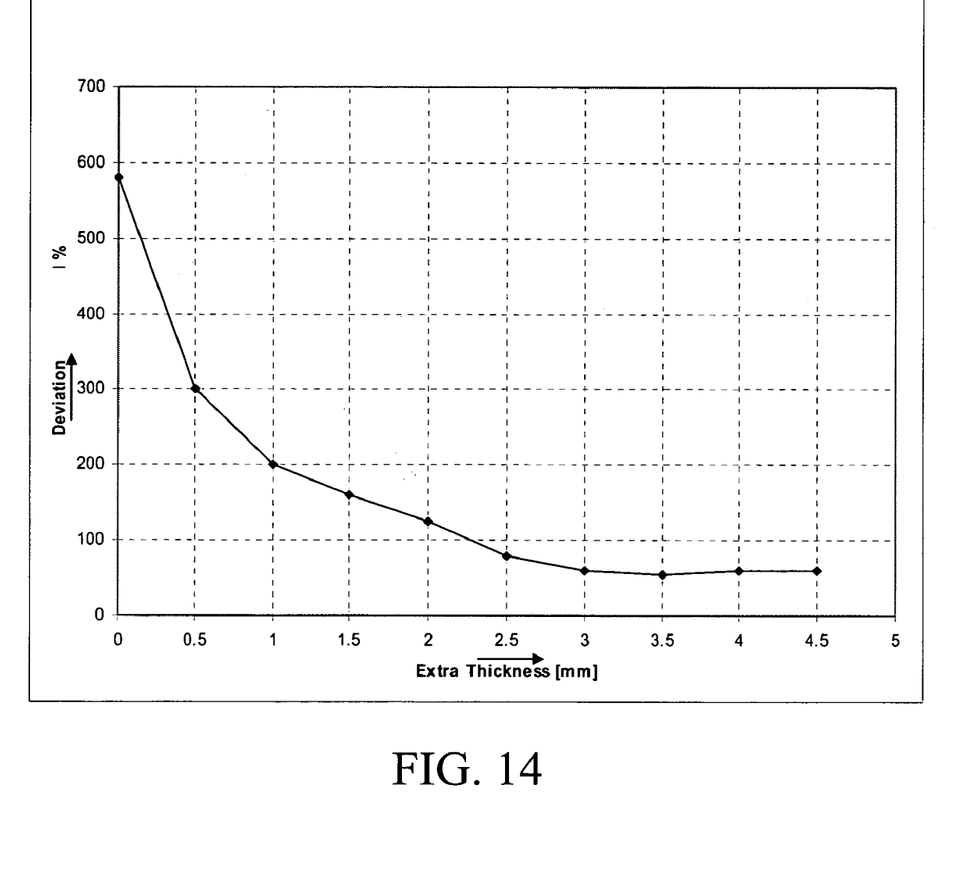
FIG. 14 depicts a graph showing simulated results of an embodiment according to FIG. 13.

FIG. 14 shows a graph with results concerning an example of the embodiment of FIG. 13. The results are results of a computer simulation, relating to the use of a collector K having eight reflective elements 11, wherein the thickness of the second layer was varied between 0 (no second layer) to 4.5 mm. In the calculations, two inner reflective elements had a first layer having a thickness of 1.6 mm, and the remaining six elements had a first layer thickness of 2 mm. The horizontal axis in FIG. 14 denotes the thickness of the second layers, whereas the vertical axis denotes an optical deviation (%) of the resulting collector K. In this case, a second layer 11B of 0.5 mm thickness (which at least partly embeds the fluid channels) already provides a significant improvement of the optical performance of the collector.

Following from the above, a reflective element of a collector may be made thicker by adding material on the outer side of the reflective element. In an embodiment, the extra material, or second layer 11B, may be added in such a way, that it surrounds one or more cooling channels. In this way, a thick element with one or more thermal conditioning channels 20 near the reflective surface may be created. For example, heat conduction from the reflective surface 13 to the one or more channels 20 will mainly appear in the inner part of the element (~the initial element shape+some material in between the cooling channels). In that case, in the outer part (of the extra material) of the element, the temperature gradient will be relatively small, or even approximately zero. Thus, the outer part 11B of the element 11 may have an approximately uniform temperature, which is equal to the temperature of the one or more cooling channels. A temperature gradient would generally only appear in the inner part of the element, and because of thermo-mechanical effects the inner part will tend to deform, while the outer part will tend to keep an undeformed shape. If the outer part 11B is made thicker than the inner part 11A, the outer part will have more stiffness, and the deformation of the reflective surface is suppressed, thus keeping a more accurate shape of the reflective surface 13. As follows from the above example (see FIG. 14), in an 8 reflective element collector, using thicker elements may cause a decrease of optical deviations on slit uniformity by approximately 600%.

Although specific reference may be made in this text to the use of lithographic apparatus in the manufacture of ICs, it should be understood that the lithographic apparatus and/or collector described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. An apparatus, comprising a collector that is constructed to receive radiation from a radiation source and to transmit radiation to an illumination system, wherein the collector comprises a reflective element which is internally provided with a fluid channel to thermally condition the collector using fluid.

2. The apparatus of claim 1, wherein the fluid channel is integrally formed in the reflective element.

3. The apparatus of claim 1, wherein the reflective element comprises a first layer, having the reflective surface, and a second layer extending on the first layer, the second layer internally provided with the fluid channel.

4. The apparatus of claim 3, wherein the thickness of the first layer of the reflective element is about 2 mm or smaller.

5. The apparatus of claim 3, wherein the second layer of the reflective element is thicker than the first layer.

6. The apparatus of claim 3, wherein the first and second layers of the reflective element are made of the same material.

7. The apparatus of claim 3, wherein the first layer of the reflective element has a first thermal expansion coefficient, the second layer of the reflective element has a second thermal expansion coefficient, and the second thermal expansion coefficient is lower than the first thermal expansion coefficient.

8. The apparatus of claim 1, wherein the fluid channel extends and/or is located closer to the reflective surface of the reflective element than to a back surface of the reflective element.

9. The apparatus of claim 1, wherein the minimum thickness of the reflective element, measured in a direction normal to the reflective surface, is at least about 2 mm.

10. A method of manufacturing a radiation collector, the method comprising providing a reflective element, wherein a fluid channel is internally provided in the reflective element to thermally condition the collector using fluid.

11. The method of claim 10, wherein the fluid channel comprises a plurality of relatively small tubes which are integrally formed with the reflective element.

12. The method of claim 10, comprising:
providing a first layer, the first layer being provided with a radiation reflective surface;
providing a fluid channel onto a back surface of the first layer; and
providing a second layer onto the back surface of the first layer, such that the fluid channel is embedded in the second layer.

13. The method of claim 12, wherein the second layer is made thicker than the first layer.

14. A method of manufacturing a device, comprising:
transmitting radiation from a radiation source to an illumination system through a collector, the collector comprising a reflective element which is internally provided with a fluid channel;
providing a beam of radiation using the illumination system;
imparting the beam with a cross-sectional pattern to form a patterned beam of radiation;
projecting the patterned beam of radiation onto a target portion of a substrate; and
thermally conditioning the collector using a fluid, the fluid being fed through the fluid channel of the reflective element of the collector.

15. An apparatus, comprising a collector that is constructed to receive radiation from a radiation source and to transmit radiation to an illumination system, wherein the collector comprises a network of fluid channels, the fluid channels being branched off to reach certain parts of the collector which are to be thermally conditioned using fluid, wherein one or more parts of the fluid channels extend along circles around a common axis of rotation of the collector and one or more other parts of the fluid channels extend substantially in a longitudinal direction of the collector.

16. A radiation collector that is constructed to receive radiation from a radiation source and to transmit radiation to an illumination system, wherein the collector comprises a plurality of rotationally symmetric, concentric reflective elements, the reflective elements being connected to each other by coupling members, the coupling members providing respective downstream shadow areas and upstream virtual shadow areas during use, and a network of thermal conditioners to thermally condition the collector, wherein the network of thermal conditioners comprises one or more first thermal conditioners extending substantially in one or more of the shadow areas and/or virtual shadow areas provided by the coupling members and one or more second thermal conditioners, branched off from the one or more first thermal conditioners.

17. The apparatus of claim 16, wherein each coupling member extends substantially laterally with respect to a virtual center axis of the collector, wherein each first thermal conditioner extends substantially along a respective virtual longitudinal plane, which plane contains the center axis of the collector and intersects at least one of the coupling members of the collector.

18. The apparatus of claim 16, wherein the second thermal conditioners extend substantially along circles that are concentric with a common longitudinal center axis of the collector.

19. The apparatus of claim 16, wherein two or more first thermal conditioners are provided, extending substantially in different shadow areas and/or virtual shadow areas provided by the coupling members of the reflective elements.

20. The apparatus of claim 16, wherein each of the reflective elements is provided with:
two first thermal conditioners extending in a substantial longitudinal direction of the reflective element, the two first thermal conditioners being symmetrically arranged around a virtual center axis of the reflective element; and
a plurality of second thermal conditioners extending along respective virtual transversal planes of the reflective element.

21. The apparatus of claim 16, wherein the one or more first thermal conditioners at least extend substantially along the full length of the reflective elements of the collector.

22. The apparatus of claim 16, wherein at least one of the first and/or second thermal conditioners comprises a fluid channel.

23. The apparatus of claim 16, wherein at least one of the first and/or second thermal conditioners comprises a heat pipe.

24. The apparatus of claim 16, wherein at least one of the second thermal conditioners extends substantially internally through a respective reflective element of the collector.

25. A method of manufacturing a device, comprising:
transmitting radiation from a radiation source to an illumination system through a collector, the collector comprising reflective elements and a plurality of coupling members which interconnect the reflective elements, such, that, in the collector, shadow areas are created downstream from the coupling members, and virtual shadow areas upstream from the coupling members;
providing a beam of radiation using the illumination system;
imparting the beam with a cross-sectional pattern to form a patterned beam of radiation;
projecting the patterned beam of radiation onto a target portion of a substrate; and
thermally conditioning the collector using a number of first and second thermal conditioners, the first thermal conditioners being arranged in one or more of the shadow areas and/or virtual shadow areas provided by the coupling members of the reflective elements of the collector, and the second thermal conditioners being branched off the first thermal conditioners.

* * * * *